US012791622B2

(12) United States Patent
Kwon et al.

(10) Patent No.: US 12,791,622 B2
(45) Date of Patent: Nov. 10, 2026

(54) CHARGE/DISCHARGE TEST SYSTEM AND CHARGE/DISCHARGE TEST METHOD

(71) Applicant: LG Energy Solution, Ltd., Seoul (KR)

(72) Inventors: Ji-Yoon Kwon, Daejeon (KR); Sang-Min Lee, Daejeon (KR); Min-Chul Jang, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 926 days.

(21) Appl. No.: 18/007,924

(22) PCT Filed: Oct. 13, 2021

(86) PCT No.: PCT/KR2021/014149
§ 371 (c)(1),
(2) Date: Dec. 2, 2022

(87) PCT Pub. No.: WO2022/080871
PCT Pub. Date: Apr. 21, 2022

(65) Prior Publication Data

US 2023/0243894 A1 Aug. 3, 2023

(30) Foreign Application Priority Data

Oct. 13, 2020 (KR) ........................ 10-2020-0132068

(51) Int. Cl.
*G01R 31/392* (2019.01)
*G01R 31/374* (2019.01)
(Continued)

(52) U.S. Cl.
CPC ......... *G01R 31/392* (2019.01); *G01R 31/374* (2019.01); *G01R 31/3835* (2019.01);
(Continued)

(58) Field of Classification Search
CPC ................ G01R 31/392; G01R 31/374; G01R 31/3835; G01R 31/382;
(Continued)

(56) References Cited

U.S. PATENT DOCUMENTS 4,413,221 A 11/1983 Benjamin et al.
5,160,880 A 11/1992 Palanisamy
(Continued)

FOREIGN PATENT DOCUMENTS

CN 101299059 A 11/2008
CN 106646267 A 5/2017
(Continued)

OTHER PUBLICATIONS

Extended European Search Report including Written Opinion for Application No. 21880518.2 dated Mar. 15, 2024, pp. 1-7.
(Continued)

*Primary Examiner* — Julian D Huffman
*Assistant Examiner* — John P Ondrasik
(74) *Attorney, Agent, or Firm* — Lerner David LLP

(57) ABSTRACT

A charging/discharging test system includes a charging/discharging test device; and a controller to output a first control signal commanding to start a charging/discharging test for a first battery. The charging/discharging test device repeatedly performs a first charge/discharge cycle until a cumulative capacity of the first battery by the first charge/discharge cycle reaches a reference capacity in response to the first control signal. The first charge/discharge cycle is comprised of a first constant current charging until a first end-of-charge voltage is reached, a first rest period, a first constant current discharging until a first end-of-discharge voltage is reached and a second rest period in a sequential order, at a first temperature condition. Each time the first charge/discharge cycle is performed, the controller adds the
(Continued)

cumulative capacity and a voltage drop of the first battery over the first rest period to a first test dataset.

8 Claims, 5 Drawing Sheets

(51) Int. Cl.
*G01R 31/3835* (2019.01)
*H02J 7/50* (2026.01)
*H02J 7/82* (2026.01)
*H02J 7/96* (2026.01)

(52) U.S. Cl.
CPC .................. *H02J 7/50* (2026.01); *H02J 7/82* (2026.01); *H02J 7/96* (2026.01)

(58) Field of Classification Search
CPC ............ G01R 31/36–396; H02J 7/0013; H02J 7/0048; H02J 7/007182; H02J 7/0047; H02J 7/005; H02J 7/00712
See application file for complete search history.

(56) References Cited

U.S. PATENT DOCUMENTS

| | | | | |
|---|---|---|---|---|
| 2008/0053715 | A1 | 3/2008 | Suzuki et al. | |
| 2008/0265841 | A1* | 10/2008 | Kim | G01R 31/387 320/132 |
| 2010/0194398 | A1 | 8/2010 | Kawasumi et al. | |
| 2016/0252586 | A1 | 9/2016 | Shimura et al. | |
| 2018/0123185 | A1 | 5/2018 | Kim et al. | |
| 2018/0164384 | A1 | 6/2018 | Kwon et al. | |
| 2019/0178948 | A1 | 6/2019 | Takahashi | |
| 2020/0191876 | A1* | 6/2020 | Shin | G01R 31/3835 |
| 2020/0217898 | A1 | 7/2020 | Lee et al. | |
| 2021/0013731 | A1 | 1/2021 | Choe et al. | |
| 2021/0080508 | A1* | 3/2021 | Kondo | H02J 7/005 |

FOREIGN PATENT DOCUMENTS

| | | | | |
|---|---|---|---|---|
| CN | 107942260 | A | 4/2018 | |
| CN | 109358292 | A | 2/2019 | |
| JP | 2001102097 | A | 4/2001 | |
| JP | 2003243048 | A | 8/2003 | |
| JP | 4866187 | B2 | 2/2012 | |
| JP | 5289083 | B2 | 9/2013 | |
| JP | 5419831 | B2 | 2/2014 | |
| JP | 2019105520 | A | 6/2019 | |
| KR | 20080096953 | A | 11/2008 | |
| KR | 20160105349 | A | 9/2016 | |
| KR | 101839141 | B1 | 3/2018 | |
| KR | 20180089698 | A | 8/2018 | |
| KR | 102010989 | B1 | 8/2019 | |
| KR | 20200069203 | A | 6/2020 | |
| KR | 20200069768 | A | 6/2020 | |
| KR | 20200086397 | A | 7/2020 | |
| WO | WO-2019240225 | A1 * | 12/2019 | H01M 10/48 |

OTHER PUBLICATIONS

International Search Report for Application No. PCT/KR2021/014149 mailed Jan. 27, 2022, pp. 1-3.
Search Report dated Feb. 10, 2026 from the Office Action for Chinese Application No. 202180041690.3 issued Feb. 14, 2026, pp. 1-3.
Jipeng, G et al.,"The characteristics of LifePO4 batteries by comparison constant power test with constant current test" China Academic Journal Electronic Publishing House, Jun. 2017, pp. 109-115, vol. 54, No. 2.

* cited by examiner

CHARGE/DISCHARGE TEST SYSTEM AND CHARGE/DISCHARGE TEST METHOD

CROSS-REFERENCE TO RELATED APPLICATIONS

The present application is a national phase entry under 35 U.S.C. § 371 of International Application No. PCT/KR2021/014149 filed Oct. 13, 2021, which claims priority from Korean Patent Application No. 10-2020-0132068 filed on Oct. 13, 2020, the disclosures of which are incorporated herein by reference in their entirety.

TECHNICAL FIELD

The present disclosure relates to technology for testing the degradation characteristics of a battery provided to test in repeated charge/discharge cycles.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low, and the energy density is high.

The charging/discharging of a battery causes not only oxidation and reduction reactions between a positive electrode, a negative electrode and an electrolyte but also side reactions. The side reaction is the major cause for the reduced capacity and lower charge/discharge efficiency of the battery. Accordingly, the battery gradually degrades as it is repeatedly charged and discharged.

The extent of side reaction and the consequential structural change within the battery (for example, lithium deposition) is greatly affected by a charge/discharge environment in which the battery is placed. In an example, even when the battery is charged and discharged at the same current rate (C-rate) over the same period of time, the degradation behaviors of the battery differ in different temperature conditions. In another example, even in the same temperature condition, the degradation behaviors of the battery differ at different C-rates used to charge or discharge.

Accordingly, to find the charge/discharge environment in which the battery is significantly degraded, it is necessary to test the battery through a variety of charge/discharge patterns.

The conventional art repeatedly charges and discharges a plurality of batteries in the same or different charge/discharge cycles for different periods of time or at different numbers of times for each battery, disassembles each battery to observe the internal parts with an eye, and finds a correlation between the duration or the number of repetitions of the corresponding charge/discharge cycle and the side reaction of the battery.

However, the above-described analysis method requires a long time for disassembly and observation and has low accuracy since analysis relies on the analyzer's opinion, and fails to make a clear comparison between test results by different charge/discharge cycles.

SUMMARY

Technical Problem

The present disclosure is designed to solve the above-described problem, and therefore the present disclosure is directed to providing a charging/discharging test system and a charging/discharging test method in which a charging/discharging test using a preset charge/discharge cycle is performed on each battery provided to test, and a relationship between the cumulative capacity of each battery and an open circuit voltage (OCV) drop over the rest period is automatically acquired as a result of the test.

Additionally, the present disclosure is further directed to providing a charging/discharging test system and a charging/discharging test method in which a comparison is made between the results of repeating each of a plurality of different charge/discharge cycles for each of a plurality of batteries having the same electrochemical specification provided to test.

Additionally, the present disclosure is further directed to providing a charging/discharging test system and a charging/discharging test method in which a comparison is made between the results of repeating the same charge/discharge cycle for a plurality of batteries having different electrochemical specifications provided to test.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

According to an aspect of the present disclosure, a charging/discharging test system includes a charging/discharging test device connectable to at least one test target; and a controller configured to output a first control signal commanding to start a charging/discharging test for a first battery provided as a first test target to the charging/discharging test device. The charging/discharging test device is configured to repeatedly perform a first charge/discharge cycle until a cumulative capacity of the first battery by the first charge/discharge cycle reaches a reference capacity in response to the first control signal. The first charge/discharge cycle is comprised of first constant current charging until a first end-of-charge voltage is reached, a first rest period, first constant current discharging until a first end-of-discharge voltage is reached and a second rest period in a sequential order, at a first temperature condition. For each time the first charge/discharge cycle is performed on the first battery once, the controller is configured to determine the cumulative capacity of the first battery, determine a voltage drop of the first battery over the first rest period, and add the cumulative capacity and the voltage drop of the first battery to a first test dataset associated with the first charge/discharge cycle.

The controller may be configured to output a second control signal commanding to start the charging/discharging test for a second battery provided as a second test target to the charging/discharging test device. The charging/discharging test device may be configured to repeatedly perform a second charge/discharge cycle until a cumulative capacity of the second battery by the second charge/discharge cycle reaches the reference capacity in response to the second control signal. The second charge/discharge cycle is comprised of the first constant current charging, the first rest period, the first constant current discharging and the second rest period in a sequential order at a second temperature condition which is different from the first temperature condition. For each time the second charge/discharge cycle is performed on the second battery once, the controller may be configured to determine the cumulative capacity of the second battery, determine a voltage drop of the second battery over the first rest period, and add the cumulative capacity and the voltage drop of the second battery to a second test dataset associated with the second charge/discharge cycle.

The controller may be configured to determine a first test curve indicating a correlation between the cumulative capacity and the voltage drop of the first battery based on the first test dataset when the charging/discharging test for the first battery is completed. The controller may be configured to determine a second test curve indicating a correlation between the cumulative capacity and the voltage drop of the second battery based on the second test dataset when the charging/discharging test for the second battery is completed. The controller may be configured to determine a cumulative capacity range in which a slope difference between the first test curve and the second test curve is equal to or larger than a threshold value.

The controller may be configured to output a third control signal commanding to start the charging/discharging test for a third battery provided as a third test target to the charging/discharging test device. The charging/discharging test device may be configured to repeatedly perform a third charge/discharge cycle until a cumulative capacity of the third battery by the third charge/discharge cycle reaches the reference capacity in response to the third control signal. The third charge/discharge cycle is comprised of the first constant current charging, the first rest period, the second constant current discharging until the second end-of-discharge voltage which is different from the first end-of-discharge voltage is reached and the second rest period in a sequential order at the first temperature condition. For each time the third charge/discharge cycle is performed on the third battery once, the controller may be configured to determine the cumulative capacity of the third battery, determine a voltage drop of the third battery over the first rest period, and add the cumulative capacity and the voltage drop of the third battery to a third test dataset associated with the third charge/discharge cycle.

The controller may be configured to determine a first test curve indicating a correlation between the cumulative capacity and the voltage drop of the first battery based on the first test dataset when the charging/discharging test for the first battery is completed. The controller may be configured to determine a third test curve indicating a correlation between the cumulative capacity and the voltage drop of the third battery based on the third test dataset when the charging/discharging test for the third battery is completed. The controller may be configured to determine a cumulative capacity range in which a slope difference between the first test curve and the third test curve is equal to or larger than a threshold value.

The controller may be configured to output a fourth control signal commanding to start the charging/discharging test for a fourth battery provided as a fourth test target to the charging/discharging test device. The charging/discharging test device may be configured to repeatedly perform a fourth charge/discharge cycle until a cumulative capacity of the fourth battery by the fourth charge/discharge cycle reaches the reference capacity in response to the fourth control signal. The fourth charge/discharge cycle is comprised of the first constant current charging, the first rest period, the second constant current discharging and the second rest period in a sequential order at the second temperature condition. Each time the fourth charge/discharge cycle is performed on the fourth battery once, the controller may be configured to determine the cumulative capacity of the fourth battery, determine a voltage drop of the fourth battery over the first rest period, and add the cumulative capacity and the voltage drop of the fourth battery to a fourth test dataset associated with the fourth charge/discharge cycle.

The controller may be configured to determine a first test curve indicating a correlation between the cumulative capacity and the voltage drop of the first battery based on the first test dataset when the charging/discharging test for the first battery is completed. The controller may be configured to determine a fourth test curve indicating a correlation between the cumulative capacity and the voltage drop of the fourth battery based on the fourth test dataset when the charging/discharging test for the fourth battery is completed. The controller may be configured to determine a cumulative capacity range in which a slope difference between the first test curve and the fourth test curve is equal to or larger than a threshold value.

The charging/discharging test system may further include an information input/output device configured to output graphical information associated with the first test dataset.

The charging/discharging test device includes at least one charging/discharging module. Each charging/discharging module may include a charger/discharger configured to control a charge current and a discharge current for the test target; a temperature regulation circuit configured to control an ambient temperature of the test target; and a sensing circuit configured to measure a voltage and current of the test target.

According to another aspect of the present disclosure, a charging/discharging test method may be performed by the charging/discharging test system. The charging/discharging test method includes outputting, by the controller, the first control signal commanding to start the charging/discharging test for the first battery provided to test to the charging/discharging test device; and acquiring, by the controller, a first test dataset associated with the first charge/discharge cycle each time the first charge/discharge cycle is performed once until a cumulative capacity of the first battery by the first charge/discharge cycle reaches the reference capacity. The step of acquiring the first test dataset associated with the first charge/discharge cycle includes determining the cumulative capacity of the first battery; determining a voltage drop of the first battery over the first rest period; and adding the cumulative capacity and the voltage drop of the first battery to the first test dataset associated with the first charge/discharge cycle.

Advantageous Effects

According to at least one of the embodiments of the present disclosure, it is possible to automatically acquire a relationship between the cumulative capacity of each battery provided to test and an open circuit voltage (OCV) drop over the rest period as a result of a charging/discharging test using the preset charge/discharge cycle for each battery.

Additionally, according to at least one of the embodiments of the present disclosure, it is possible to quantitatively compare the results of repeating each of a plurality of different charge/discharge cycles for each of a plurality of batteries having the same electrochemical specification provided to test with respect to the same cumulative capacity.

Additionally, according to at least one of the embodiments of the present disclosure, it is possible to quantitatively compare the results of repeating the same charge/discharge cycle for a plurality of batteries having different electrochemical specifications provided to test with respect to the same cumulative capacity.

The effects of the present disclosure are not limited to the effects mentioned above, and these and other effects not mentioned herein will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

DETAILED DESCRIPTION

Figure 1:
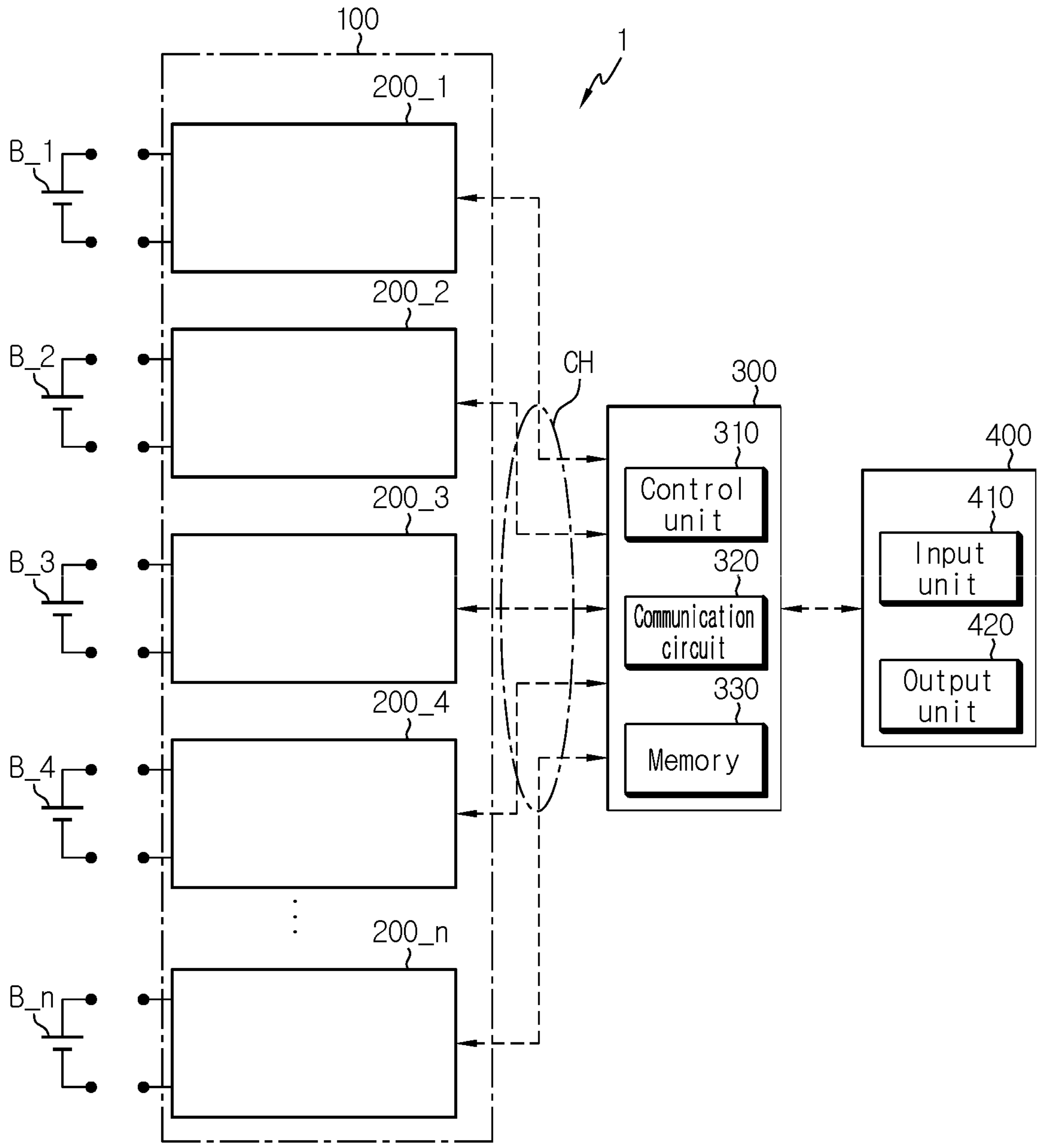
FIG. 1 is a diagram schematically showing a configuration of a charging/discharging test system according to an embodiment of the present disclosure.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and the illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "unit" as used herein refers to a processing unit of at least one function or operation, and this may be implemented by hardware and software either alone or in combination.

In addition, throughout the specification, it will be further understood that when an element is referred to as being "connected to" another element, it can be directly connected to the other element or intervening elements may be present.

Figure 2:
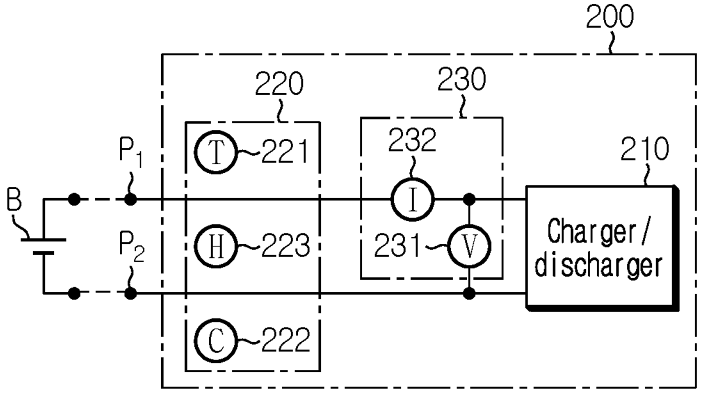
FIG. 2 is a diagram schematically showing a configuration of a charging/discharging module of FIG. 1.
Figure 3:
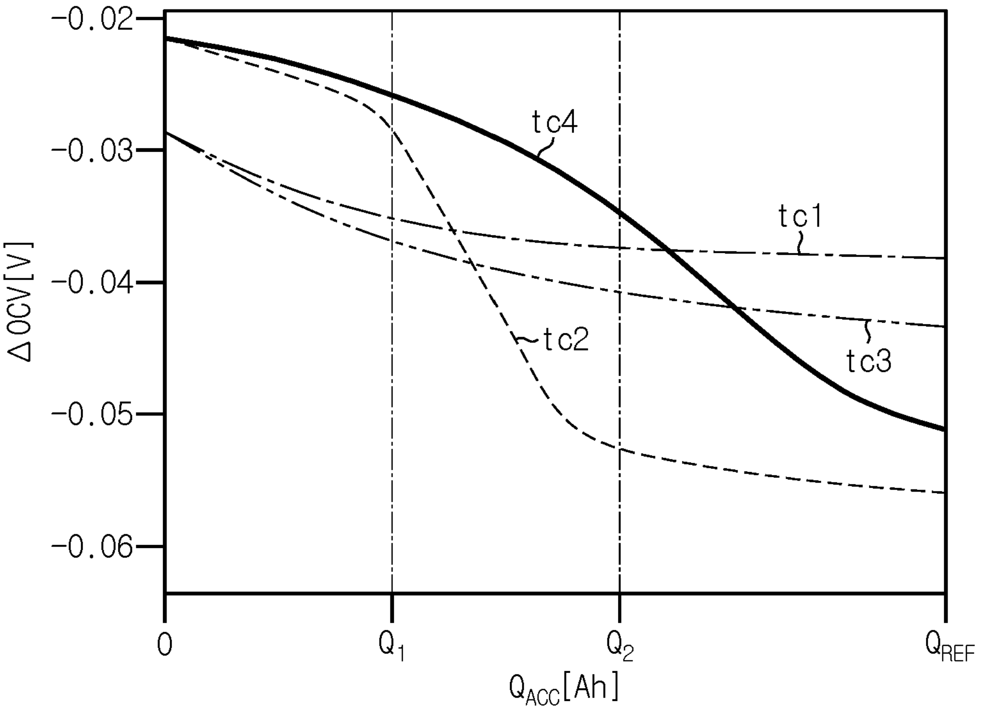
FIG. 3 is a diagram exemplarily showing charging/discharging test results using a plurality of charge/discharge cycles for a plurality of batteries provided to test.

FIG. 1 is a diagram schematically showing a configuration of a charging/discharging test system according to an embodiment of the present disclosure. FIG. 2 is a diagram schematically showing a configuration of a charging/discharging module of FIG. 1. FIG. 3 is a diagram exemplarily showing charging/discharging test results using a plurality of charge/discharge cycles for a plurality of batteries provided to test.

Referring to FIG. 1, the charging/discharging test system 1 includes a charging/discharging test device 100 and a controller 300.

The charging/discharging test device 100 includes at least one charging/discharging module 200. When the charging/discharging test device 100 includes two or more charging/discharging modules 200_1~**200_*n* (n is a natural number of 2 or greater), it is possible to simultaneously perform a charging/discharging test for two or more batteries B_1~B_n provided to test, thereby improving the temporal efficiency. Hereinafter, the reference number 200 is used in the common description of the plurality of charging/discharging modules 200_1~200_*n*, and the reference symbol B is used in the common description of the plurality of batteries B_1**~B_n.

Referring to FIG. 2, the charging/discharging module 200 includes a charger/discharger 210, a temperature regulation circuit 220 and a sensing circuit 230.

The charger/discharger 210 includes a pair of test terminals $P_1$, $P_2$ which are attached/detached to/from a positive electrode terminal and a negative electrode terminal of the battery B. A positive electrode terminal and a negative electrode terminal of the battery B provided to test are connected to the charger/discharger 210 through the pair of test terminals $P_1$, $P_2$. The charger/discharger 210 is configured to charge and discharge the connected battery B to be tested in response to a command from the controller 300. In an example, the charger/discharger 210 may include a bidirectional DC-DC converter or a bidirectional DC-AC converter. The charger/discharger 210 is configured to control the charge current, charge voltage, discharge current and/or discharge voltage for the battery B according to a voltage condition and a current condition of the charge/discharge cycle required by a control signal from the controller 300 in response to the control signal.

The temperature regulation circuit 220 maintains or controls the ambient temperature of the battery B according to a temperature condition of the charge/discharge cycle required by the control signal from the controller 300 during the charge/discharge of the battery B in response to the control signal. For example, the temperature regulation circuit 220 includes a temperature sensor 221, a cooling circuit 222 (for example, a fan) and a heating circuit 223 (for example, a heater), and may maintain the ambient temperature during the charge/discharge cycle at the temperature required by the control signal through feedback between them. As described above, when the charging/discharging test is simultaneously performed on two or more batteries B, to prevent temperature interference between the batteries B, the temperature regulation circuit 220 may further include a case (for example, a chamber) to physically isolate an area in which the battery B, the temperature sensor 221, the cooling circuit 222 and the heating circuit 223 are positioned away from other charging/discharging module. In this case, the battery B may be coupled to the charger/discharger 210 when received in the case including the temperature sensor 221, the cooling circuit 222 and the heating circuit 223.

The sensing circuit 230 is electrically connected to a pair of wirings connecting the pair of test terminals $P_1$, $P_2$ to the charger/discharger 210. The sensing circuit 230 includes a current sensor 232. While the charger/discharger 210 is charging and discharging the battery B, the current sensor 232 may detect a charge/discharge current of the battery B at a preset time interval and transmit a current value indicating the detected current to the controller 300. The sensing circuit 230 includes a voltage sensor 231. While the charger/discharger 210 is charging and discharging the battery B, the voltage sensor 231 may detect a voltage of the battery B at the preset time interval or when a predetermined event (for example, a change from charging to resting) occurs, and transmit a voltage value indicating the detected voltage to the controller 300.

Referring back to FIG. 1, the controller 300 includes a control unit 310, a communication circuit 320 and a memory 330. The control unit 310 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing other functions.

The communication circuit 320 is operably coupled to the charging/discharging test device 100 through a communication channel CH and is configured to support wired or wireless communication between the control unit 310 and the charging/discharging test device 100. Being "Operably coupled" refers to being directly/indirectly connected to transmit and receive a signal in one or two directions. The wired communication may be, for example, controller area network (CAN) communication, and the wireless communication may be, for example, Zigbee or Bluetooth communication. The communication protocol is not limited to a particular type and may include any communication protocol that supports the wired/wireless communication between the control unit 310 and the charging/discharging test device 100. The communication circuit 320 transmits the control signal from the control unit 310 to the charger/discharger 210, and transmits the sensing data (for example, the current value, the voltage value) of the battery B acquired by the sensing circuit 230 of the charging/discharging module 200 to the control unit 310.

The memory 330 may include at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM), or programmable read-only memory (PROM). The memory 330 may store data and programs required for the operation of the control unit 310. The memory 330 may store data indicating the results of computation performed by the control unit 310.

The charging/discharging test device 100 may further include an information input/output device 400. The information input/output device 400 may include an input unit 410 (for example, a keyboard, a microphone, etc.) and an output unit 420 (for example, a speaker, a display). The information input/output device is configured to receive a user input, and output the results of the charging/discharging test performed according to the user input in a visual and/or auditory form.

The controller 300 transmits the control signal(s) to at least one charging/discharging device 200 sequentially or simultaneously according to the user input received by the information input/output device 400 or preset test schedule information. For example, when the user input commanding to simultaneously perform the plurality of charge/discharge cycles using the plurality of charging/discharging modules 200_1~200_*n* is received through the information input/output device 400, the controller 300 may output each of the plurality of control signals associated with the plurality of charge/discharge cycles to each of the plurality of charging/discharging modules 200.

For convenience of description, the present disclosure describes a charging/discharging test procedure using each of the first to fourth charge/discharge cycles which are different for the first to fourth batteries B_1~B_4 for illustrative purposes. In addition to the first to fourth charge/discharge cycles, the test may be performed using additional charge/discharge cycle(s) to evaluate the performance required for the test target.

One first charge/discharge cycle is comprised of first constant current charging (for example, 1.0 C-rate) until a first end-of-charge voltage (for example, 4.2 V) is reached, a first rest period (for example, 30 minutes), first constant current discharging (for example, 0.5 C-rate) until a first end-of-discharge voltage (for example, 3.0 V) is reached and a second rest period (for example, 60 minutes) in a sequential order at a first temperature condition (for example, 25° C.).

One second charge/discharge cycle is comprised of first constant current charging until the first end-of-charge voltage is reached, the first rest period, first constant current discharging until the first end-of-discharge voltage is reached and the second rest period in a sequential order at a second temperature condition (for example, 45° C.).

One third charge/discharge cycle is comprised of first constant current charging until the first end-of-charge voltage is reached, the first rest period, second constant current discharging until a second end-of-discharge voltage (for example, 2.5 V) different from the first end-of-discharge voltage is reached and the second rest period in a sequential order at the first temperature condition.

One fourth charge/discharge cycle is comprised of first constant current charging until the first end-of-charge voltage is reached, the first rest period, second constant current discharging until the second end-of-discharge voltage which is different from the first end-of-discharge voltage is reached and the second rest period in a sequential order at the second temperature condition.

In each charge/discharge cycle, the constant current charging ends when voltage between the pair of test terminals $P_1$, $P_2$ provided in the charging/discharging module 200 rises to the end-of-charge voltage, and the constant current discharging ends when voltage between the pair of test terminals $P_1$, $P_2$ provided in the charger/discharger 210 drops down to the end-of-discharge voltage.

The first to fourth charging/discharging modules 200_1~200_4 are configured to repeat each of the first to fourth charge/discharge cycles for each of the first to fourth batteries B_1~B_4 to be tested until the cumulative capacity by each of the first to fourth charge/discharge cycles reaches the reference capacity ($Q_{REF}$ in FIG. 3) in response to the first to fourth control signals. While the first charge/discharge cycle is repeatedly performed on the first battery B_1, the ambient temperature of the first battery B_1 is maintained in the first temperature condition by the temperature regulation circuit 220 of the first charging/discharging module 200_1, and the current value and the voltage value detected by the sensing circuit 230 of the first charging/discharging module 200_1 are transmitted to the controller 300 at the preset time interval or each time a request from the controller 300 is made. The same procedure is performed on the remaining batteries B_2~B_4.

Each time the first charge/discharge cycle is performed on the first battery B_1 once, the controller 300 determines the cumulative capacity of the first battery B_1 at the end of the first constant current charging, and determines the voltage drop of the first battery B_1 over the first rest period. The controller 300 may record, in the memory 330, the cumulative capacity and voltage drop of the first battery B_1 determined repeatedly in time series as a first test dataset associated with the first charge/discharge cycle.

The cumulative capacity of the first battery B_1 is the sum of charge capacity and discharge capacity of the first battery B_1 by repetition of the first charge/discharge cycle. The controller 300 may determine the cumulative capacity of the first battery B_1 at the end of the first constant current charging by accumulating the magnitude of the current value transmitted from the first charging/discharging module 200_1 over time during the first charge/discharge cycle.

The voltage drop of the first battery B_1 over the first rest period is a difference between Open Circuit Voltage (OCV) of the first battery B_1 at the end of the first constant current charging and OCV of the first battery B_1 after the lapse of the first rest period from the end of the first constant current charging.

Each time the second charge/discharge cycle is performed on the second battery B once, the controller 300 determines the cumulative capacity of the second battery B_2 at the end of the first constant current charging, and determines the voltage drop of the second battery B_2 over the first rest period. The controller 300 may record, in the memory 330, the cumulative capacity and the voltage drop of the second battery B_2 determined repeatedly in time series as a second test dataset associated with the second charge/discharge cycle.

The cumulative capacity of the second battery B_2 is the sum of charge capacity and discharge capacity of the second battery B_2 by repetition of the second charge/discharge cycle. The controller 300 may determine the cumulative capacity of the second battery B_2 at the end of the first constant current charging by accumulating the magnitude of the current value transmitted from the second charging/discharging module 200_2 over time during the second charge/discharge cycle.

The voltage drop of the second battery B_2 over the first rest period is a difference between OCV of the second battery B_2 at the end of the first constant current charging and OCV of the second battery B_2 after the lapse of the first rest period from the end of the first constant current charging.

Each time the third charge/discharge cycle is performed on the third battery B_3 once, the controller 300 determines the cumulative capacity of the third battery B_3 at the end of the first constant current charging, and determines the voltage drop of the third battery B over the first rest period. The controller 300 may record, in the memory 330, the cumulative capacity and the voltage drop of the third battery B_3 determined repeatedly in time series as a third test dataset associated with the third charge/discharge cycle.

The cumulative capacity of the third battery B_3 is the sum of charge capacity and discharge capacity of the third battery B_3 by repetition of the third charge/discharge cycle. The controller 300 may determine the cumulative capacity of the third battery B_3 at the end of the first constant current charging by accumulating the magnitude of the current value transmitted from the third charging/discharging module 200_3 over time during the third charge/discharge cycle.

The voltage drop of the third battery B_3 over the first rest period is a difference between OCV of the third battery B_3 at the end of the first constant current charging and OCV of the third battery B_3 after the lapse of the first rest period from the end of the first constant current charging.

Each time the fourth charge/discharge cycle is performed on the fourth battery B_4 once, the controller 300 determines the cumulative capacity of the fourth battery B_4 at the end of the first constant current charging, and determines the voltage drop of the fourth battery B_4 over the first rest period. The controller 300 may record, in the memory 330, the cumulative capacity and the voltage drop of the fourth battery B_4 determined repeatedly in time series as a fourth test dataset associated with the fourth charge/discharge cycle.

The cumulative capacity of the fourth battery B_4 is the sum of charge capacity and discharge capacity of the fourth battery B_4 by repetition of the fourth charge/discharge cycle. The controller 300 may determine the cumulative capacity of the fourth battery B_4 at the end of the first constant current charging by accumulating the magnitude of the current value transmitted from the fourth charging/discharging module 200_4 over time during the fourth charge/discharge cycle.

The voltage drop of the fourth battery B_4 over the first rest period is a difference between OCV of the fourth battery B_4 at the end of the first constant current charging and OCV of the fourth battery B_4 after the lapse of the first rest period from the end of the first constant current charging.

In each of the above-described charge/discharge cycles, the magnitude of the voltage drop of each battery B corresponds to the extent of side reaction of each battery B caused by repetition of each charge/discharge cycle. That is, as the side reaction of each battery B accumulates during the charge/discharge cycle, the available capacity of each battery B reduces, and as the side reaction of each battery B gets severe, the voltage drop of each battery B also increases and the slope of the voltage drop appearing in a test curve (see FIG. 3) may increase to a negative value.

The first to fourth batteries B_4 are any type of battery that can be recharged repeatedly, for example, a lithium ion battery, and they may be new products having the same electrochemical specification. Alternatively, any one of the first to fourth batteries B_4 may have a different electrochemical specification from at least one of the remaining batteries. For example, the first battery B_1 and the second battery B_2 may have the same specification, and the third battery B_3 and the fourth battery B_4 may include an electrolyte of a different type and/or in a different amount from that of the first battery B_1 and the second battery B_2, or may further include an additive.

Referring now to FIG. 3, the horizontal axis indicates the cumulative capacity $Q_{ACC}$, and the vertical axis indicates the voltage drop ΔOCV. First to fourth test curves tc1~tc4 indicate relationships between the cumulative capacity and the voltage drop of the first to fourth batteries B_1~B_4, respectively. Each test curve may be generated through curve fitting of values recorded in time series as the cumulative capacity and values recorded in time series as the voltage drop. The information input/output device 400 may display graphical information corresponding to at least one of the first to fourth test curves tc1~tc4 from the controller 300.

When comparing the first test curve tc1 with the second test curve tc2, since the second temperature condition is higher than the first temperature condition at the early stage of the charging/discharging test, the voltage drop of the second battery B_2 is smaller than the voltage drop of the first battery B_1. However, as the charging/discharging test proceeds, the voltage drop of the second battery B_2 is larger than the voltage drop of the first battery B_1. A similar relationship is found between the third test curve tc3 and the fourth test curve tc4. From these findings, it can be seen that side reaction causes severer degradation in a higher temperature environment.

When comparing the first test curve tc1 with the third test curve tc3, the voltage drop of the third battery B_3 is larger than the voltage drop of the first battery B_1. From these findings, it can be seen that the second end-of-discharge voltage causes severer degradation of the battery B than the first end-of-discharge voltage at the first temperature condition.

When comparing the second test curve tc2 with the fourth test curve tc4, the voltage drop of the fourth battery B_4 shows a gentle change over the entire charging/discharging test, while the voltage drop of the second battery B_2 rapidly increases at the early stage of the charging/discharging test. From these findings, it can be seen that the first end-of-discharge voltage causes severer degradation of the battery B than the second end-of-discharge voltage at the second temperature condition. That is, according to the present disclosure, it is possible to quantitatively compare two or more test curves, and thus help to identify a slope difference of the voltage drop due to different degradation factors (for example, the end-of-discharge voltage) which are continuously applied to the battery B.

The controller 300 may select at least one pair of possible combinations of test curves (for example, tc1 and tc2, tc1 and tc3, tc1 and tc4, etc.) from the first to fourth test curves tc1~tc4, and determine a cumulative capacity range in which the slope difference between each pair of selected test curves is equal to or larger than a threshold value. For example, referring to FIG. 3, $Q_1$~$Q_2$ indicates the cumulative capacity range in which the slope difference between the second test curve tc2 and the fourth test curve tc4 is equal to or larger than the threshold value.

Figure 4:
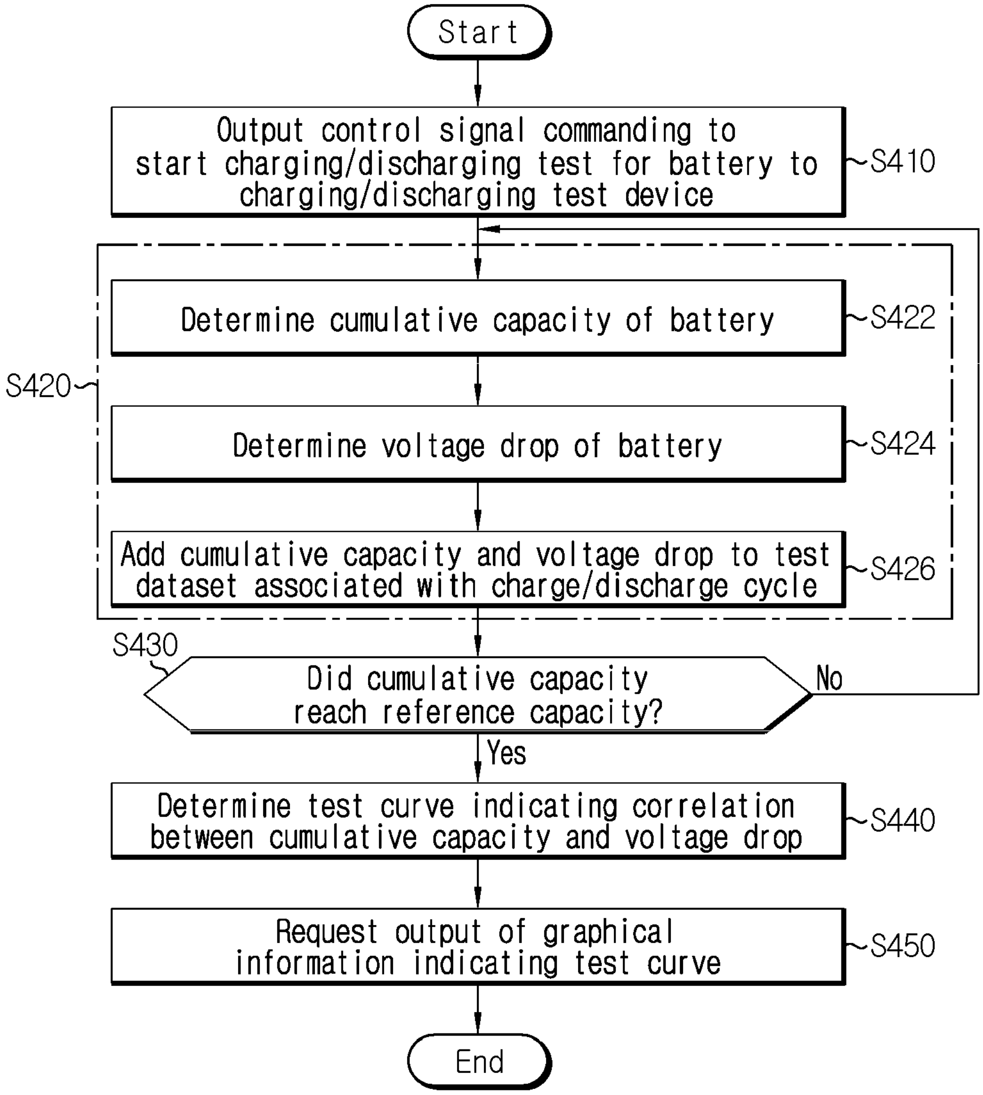
FIG. 4 is a flowchart exemplarily showing a charging/discharging test method according to a first embodiment, executable by the charging/discharging test system shown in FIG. 1.

FIG. 4 is a flowchart exemplarily showing a charging/discharging test method according to a first embodiment, executable by the charging/discharging test system 1 shown in FIG. 1.

Referring to FIGS. 1 to 4, in step S410, the controller 300 outputs a control signal commanding to start a charging/discharging test for a battery B provided to test to the charging/discharging test device 100. Accordingly, the charging/discharging test device 100 starts the charging/discharging test for the battery B using a charge/discharge cycle required for the control signal.

In step S420, the controller 300 acquires a test dataset associated with the charge/discharge cycle during the charging/discharging test of the battery B.

The step S420 includes determining a cumulative capacity of the battery B at the end of constant current charging included in the charge/discharge cycle (S422), determining a voltage drop of the battery B over the rest period from the end of constant current charging included in the charge/discharge cycle (S424) and adding the cumulative capacity and the voltage drop of the battery B to the test dataset associated with the charge/discharge cycle (S426). That is, the test dataset is updated each time the charge/discharge cycle is performed once during the charging/discharging test of the battery B.

In step S430, the controller 300 determines if the cumulative capacity of the battery B by the charge/discharge cycle reached the reference capacity. When a value of the step S430 is "No", the method reverts to the step S420. The value of the step S430 being "Yes" indicates that the charging/discharging test of the battery B is completed. When the value of the step S430 is "Yes", the method may move to step S440.

In the step S440, the controller 300 determines a test curve indicating the correlation between the cumulative capacity and the voltage drop of the battery B based on the test dataset.

In step S450, the controller 300 may request the output of graphical information indicating the test curve to the information input/output device 400.

Figure 5:
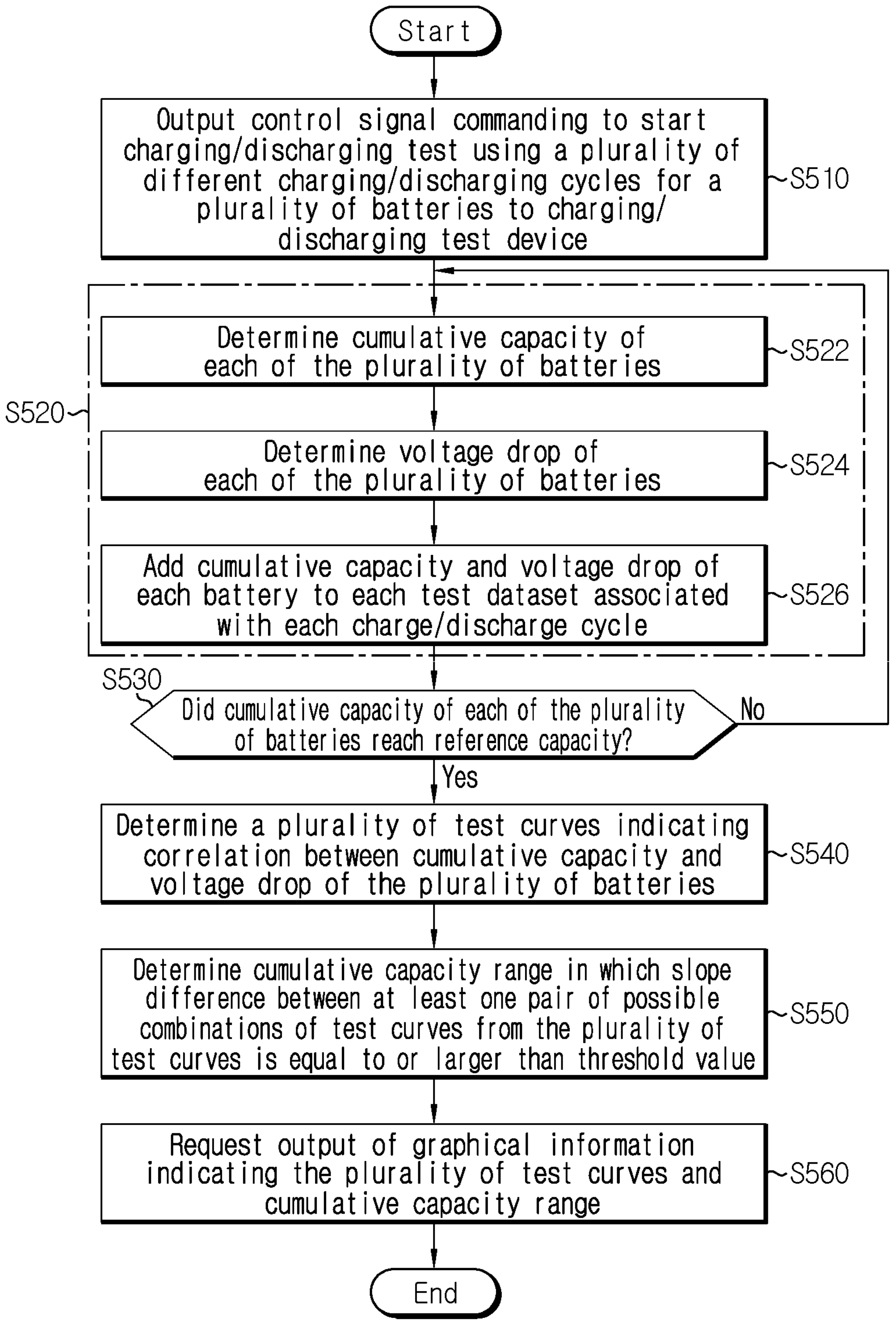
FIG. 5 is a flowchart exemplarily showing a charging/discharging test method according to a second embodiment, executable by the charging/discharging test system shown in FIG. 1.

FIG. 5 is a flowchart exemplarily showing a charging/discharging test method according to a second embodiment, executable by the charging/discharging test system 1 shown in FIG. 1.

Referring to FIGS. 1 to 3 and 5, in step S510, the controller 300 outputs a control signal commanding to start a charging/discharging test using a plurality of different charging/discharging cycles for each of a plurality of batteries B_1~B_4 provided to test to the charging/discharging test device 100. Accordingly, the plurality of charging/discharging modules 200_1~200_4 of the charging/discharging test device 100 starts the charging/discharging test for each of the plurality of batteries B using the plurality of charge/discharge cycles required for the control signal.

In step S520, the controller 300 acquires a plurality of test datasets associated with the plurality of charge/discharge cycles during the charging/discharging test of the plurality of batteries B_1~B_4.

The step S520 includes determining a cumulative capacity of each battery B at the end of constant current charging included in each charge/discharge cycle (S522), determining a voltage drop of each battery B over the rest period included in each charge/discharge cycle (S524) and adding the cumulative capacity and the voltage drop of each battery B to each test dataset associated with each charge/discharge cycle (S526). That is, each test dataset is updated each time the charge/discharge cycle is performed once during the charging/discharging test of each battery B.

In step S530, the controller 300 determines if the cumulative capacity of the plurality of batteries B_1~B_4 by the plurality of charge/discharge cycles reached the reference capacity. When a value of the step S530 is "No", the method reverts to the step S520. The value of the step S530 being "Yes" indicates that the charging/discharging test for all the plurality of batteries B_1~B_4 is completed. When the value of the step S530 is "Yes", the method may move to step S540.

In the step S540, the controller 300 determines a plurality of test curves indicating the correlation between the cumulative capacity and the voltage drop of the plurality of batteries B_1~B_4 based on the plurality of test datasets.

In step S550, the controller 300 determines a cumulative capacity range in which a slope difference between at least one pair of possible combinations of test curves from the plurality of test curves tc1~tc4 is equal to or larger than the threshold value.

In step S560, the controller 300 requests the output of graphical information indicating the plurality of test curves tc1~tc4 and the cumulative capacity range $Q_1$~$Q_2$ to the information input/output device 400.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments described above.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. A charging/discharging test system, comprising:

a controller configured to output a first control signal commanding to start a charging/discharging test for a first battery provided as a first test target to a charging/discharging test device, wherein the first control signal causes the charging/discharging test device to repeatedly perform a first charge/discharge cycle until a cumulative capacity of the first battery by the first charge/discharge cycle reaches a reference capacity, wherein the first charge/discharge cycle is comprised of a first constant current charging until a first end-of-charge voltage is reached, a first rest period, a first constant current discharging until a first end-of-discharge voltage is reached and a second rest period in a sequential order, at a first temperature condition, and wherein the controller, for each time the first charge/discharge cycle is performed on the first battery, is configured to:

determine the cumulative capacity of the first battery, determine a voltage drop of the first battery over the first rest period, and add the cumulative capacity and the voltage drop of the first battery to a first test dataset associated with the first charge/discharge cycle; and output a second control signal commanding to start the charging/discharging test for a second battery provided as a second test target to the charging/discharging test device;

wherein the second control signal causes the charging/discharging test device to repeatedly perform a second charge/discharge cycle until a cumulative capacity of the second battery by the second charge/discharge cycle reaches the reference capacity, wherein the second charge/discharge cycle is comprised of the first constant current charging, the first rest period, the first constant current discharging and the second rest period in a sequential order at a second temperature condition which is different from the first temperature condition, and wherein the controller, for each time the second charge/discharge cycle is performed on the second battery, is configured to:

determine a cumulative capacity of the second battery;

determine a voltage drop of the second battery over the first rest period; and add the cumulative capacity and the voltage drop of the second battery to a second test dataset associated with the second charge/discharge cycle; and determine a first test curve indicating a correlation between the cumulative capacity and the voltage drop of the first battery based on the first test dataset when the charging/discharging test for the first battery is completed;

determine a second test curve indicating a correlation between the cumulative capacity and the voltage drop of the second battery based on the second test dataset when the charging/discharging test for the second battery is completed; and determine a cumulative capacity range in which a slope difference between the first test curve and the second test curve is equal to or larger than a threshold value.

2. The charging/discharging test system according to claim 1, wherein the controller is configured to:

output a third control signal commanding to start the charging/discharging test for a third battery provided as a third test target to the charging/discharging test device, wherein the third control signal causes the charging/discharging test device to repeatedly perform a third charge/discharge cycle until a cumulative capacity of the third battery by the third charge/discharge cycle reaches the reference capacity, wherein the third charge/discharge cycle is comprised of the first constant current charging, the first rest period, a second constant current discharging until a second end-of-discharge voltage which is different from the first end-of-discharge voltage is reached and the second rest period in a sequential order at the first temperature condition, and wherein the controller, for each time the third charge/discharge cycle is performed on the third battery, is configured to:

determine the cumulative capacity of the third battery, determine a voltage drop of the third battery over the first rest period, and add the cumulative capacity and the voltage drop of the third battery to a third test dataset associated with the third charge/discharge cycle.

3. The charging/discharging test system according to claim 2, wherein the controller is configured to:

determine a third test curve indicating a correlation between the cumulative capacity and the voltage drop of the third battery based on the third test dataset when the charging/discharging test for the third battery is completed, and determine a cumulative capacity range in which a slope difference between the first test curve and the third test curve is equal to or larger than a threshold value.

4. The charging/discharging test system according to claim 1, wherein the controller is configured to:

output a fourth control signal commanding to start the charging/discharging test for a fourth battery provided as a fourth test target to the charging/discharging test device, wherein the fourth control signal causes the charging/discharging test device to repeatedly perform a fourth charge/discharge cycle until a cumulative capacity of the fourth battery by the fourth charge/discharge cycle reaches the reference capacity, wherein the fourth charge/discharge cycle is comprised of the first constant current charging, the first rest period, a second constant current discharging until a second end-of-discharge voltage which is different from the first end-of-discharge voltage is reached and the second rest period in a sequential order at a second temperature condition which is different from the first temperature condition, wherein the controller, for each time the fourth charge/discharge cycle is performed on the fourth battery, is configured to:

determine the cumulative capacity of the fourth battery, determine a voltage drop of the fourth battery over the first rest period, and add the cumulative capacity and the voltage drop of the fourth battery to a fourth test dataset associated with the fourth charge/discharge cycle.

5. The charging/discharging test system according to claim 4, wherein the controller is configured to:

determine a fourth test curve indicating a correlation between the cumulative capacity and the voltage drop of the fourth battery based on the fourth test dataset when the charging/discharging test for the fourth battery is completed, and determine a cumulative capacity range in which a slope difference between the first test curve and the fourth test curve is equal to or larger than a threshold value.

6. The charging/discharging test system according to claim 1, further comprising:

an information input/output device configured to output graphical information associated with the first test dataset.

7. The charging/discharging test system according to claim 1, further comprising the charging/discharging test device, wherein the charging/discharging test device includes at least one charging/discharging module, and each charging/discharging module includes:

a charger/discharger configured to control a charge current and a discharge current for the first test target;

a temperature regulation circuit configured to control an ambient temperature of the first test target; and a sensing circuit configured to measure a voltage and current of the first test target.

8. A charging/discharging test method, comprising:

outputting, by a controller, a first control signal commanding to start a charging/discharging test for a first battery provided to test a charging/discharging test device; and acquiring, by the controller, data for a first test dataset each time a first charge/discharge cycle is performed until a cumulative capacity of the first battery by the first charge/discharge cycle reaches a reference capacity, wherein the first charge/discharge cycle is comprised of a first constant current charging until a first end-of-charge voltage is reached, a first rest period, a first constant current discharging until a first end-of-discharge voltage is reached and a second rest period in a sequential order, at a first temperature condition, and, wherein the acquiring the data for the first test dataset associated with the first charge/discharge cycle includes:

determining the cumulative capacity of the first battery;

determining a voltage drop of the first battery over the first rest period;

adding the cumulative capacity and the voltage drop of the first battery to the first test dataset associated with the first charge/discharge cycle; and outputting a second control signal commanding to start the charging/discharging test for a second battery provided as a second test target to the charging/discharging test device;

wherein the second control signal causes the charging/discharging test device to repeatedly perform a second charge/discharge cycle until a cumulative capacity of the second battery by the second charge/discharge cycle reaches the reference capacity, wherein the second charge/discharge cycle is comprised of the first constant current charging, the first rest period, the first constant current discharging and the second rest period in a sequential order at a second temperature condition which is different from the first temperature condition, and wherein the acquiring the data for a second test dataset associated with the second charge/discharge cycle includes:

determining a cumulative capacity of the second battery;

determining a voltage drop of the second battery over the first rest period, and adding the cumulative capacity and the voltage drop of the second battery to a second test dataset associated with the second charge/discharge cycle, determining a first test curve indicating a correlation between the cumulative capacity and the voltage drop of the first battery based on the first test dataset when the charging/discharging test for the first battery is completed;

determining a second test curve indicating a correlation between the cumulative capacity and the voltage drop of the second battery based on the second test dataset when the charging/discharging test for the second battery is completed; and determining a cumulative capacity range in which a slope difference between the first test curve and the second test curve is equal to or larger than a threshold value.

* * * * *